ize Patent [19]

Baumgartner

[11] Patent Number: 4,732,238

[45] Date of Patent: Mar. 22, 1988

[54] OBSTACLE DETECTION SYSTEM FOR AUTOMATICALLY CONTROLLED ELEVATOR DOORS

[75] Inventor: Max Baumgartner, Lucerne, Switzerland

[73] Assignee: Inventio AG, Switzerland

[21] Appl. No.: 895,245

[22] Filed: Aug. 11, 1986

[30] Foreign Application Priority Data

Aug. 22, 1985 [CA] Canada ................. 3612/85

[51] Int. Cl.⁴ .............................. B66B 13/26
[52] U.S. Cl. ................. 187/104; 187/52 R; 49/25; 49/26
[58] Field of Search .......... 187/51, 52 R, 56, DIG. 1, 187/103, 104; 49/25, 26, 28; 340/562

[56] References Cited

U.S. PATENT DOCUMENTS 4,029,176  6/1977  Mills ................. 187/52 R
4,621,452  11/1986  Deeg ................. 187/52 R X

FOREIGN PATENT DOCUMENTS 0140340  10/1979  Japan ................. 187/51
82/02536  8/1982  World Int. Prop. O. ........ 187/52 R Primary Examiner—Joseph J. Rolla
Assistant Examiner—Nils E. Pedersen
Attorney, Agent, or Firm—Marshall & Melhorn

[57] ABSTRACT

Capacitively sensitive antennas are located at the closing edges of automatically controlled elevator doors to generate error signals by way of differential amplifiers if capacitively influenced by an obstacle or a disturbance. A door travel detector and pulse generator divide the entire door region into incremental travel distances of, for instance, one centimeter steps to control a compensator which consists of a threshold value detector, a forward/reverse counter and a digital/analog converter. Every error signal is subjected to compensation at every door movement for the associated travel distance increment and floor and the determined compensation value is stored for use in the next compensation cycle. The compensation maximally attainable pertravel distance increment is chosen in such a manner, that it is not significant for rapidly variable obstacle error signals caused by persons or objects, while slowly variable disturbance error signals, due to, for instance, mechanical tolerances or temperature variations, are reduced to a minimal residual amplitude. For this reason, obstacle signals will prevent, stop or reverse a door closing movement by way of an error signal evaluating circuit and door circuits, while disturbance signals remain ineffective with regard to door control.

21 Claims, 4 Drawing Figures

OBSTACLE DETECTION SYSTEM FOR AUTOMATICALLY CONTROLLED ELEVATOR DOORS

BACKGROUND OF THE INVENTION

The present invention relates generally to automatic controls for elevator doors, and particularly to a detection system for the recognition of obstacles.

There are many prior art devices for detecting or recognizing persons or objects within a given spatial region and are, therefore, applicable as safety devices. Examples of their use, for instance, are for the burglary proofing of rooms, as personal protection on dangerous machines, for the protection of working platforms, as well as anticollision protection on vehicles.

The prevailing state of technology of closure security devices for automatic elevator doors is characterized by the use of sensors of the most varied type of construction, such as for instance, mechanical feeler edges, light barriers, ultrasound devices, as well as capacitive and inductive measuring equipment. International patent application PCT/GB No. 82/00022 discloses a closure security device for elevator doors in which capacitive approach sensors with antennas are distributed across the door edges. The sensor signals emitted by the approach sensors are dependent on the ground capacitance of the pertinent antennas and are fed in pairs to differential amplifiers which generate error signals. The error signals control the door by way of an evaluating circuit. Obstacles in the region of the door, such as for instance a person or an object, change the ground capacitance of the sensor antennas in a distinct manner, so that the closing of the door can be prevented, stopped or reversed by least one of the error signals. In order that the differential amplifiers are operated within their regular working range during recognition of an obstacle, the sensors emit approximately equal sensor signals under obstacle-free conditions in spite of unequal earth capacitances caused for instance by the installation conditions. The sensors are balanced in pairs under obstacle-free conditions by compensators with incremental balancing memories and each sensor exhibits a special compensation input. In each case, a compensator is combined with a differential amplifier and one of the two associated sensors into a control circuit which balances the one sensor signal to the other until the pertinent error signal is zero. This compensation takes place in obstacle free conditions, for instance a door open one centimeter, and is triggered at the beginning of every door opening movement automatically by a microswitch.

In the above and similar electronically operated door security systems, the problem is to distinguish whether an error signal is due to an obstacle and must therefore be active in controlling the door, or whether it has been caused by an interference and should therefore be ignored for the purpose of door control. Such interferences result from the structural design of the elevator shaft, unevenly running and badly aligned doors, mechanical tolerances, as well as long term influences, such as dirt, humidity and mechanical deformations. For the solution to this problem the aforesaid patent relies on the knowledge that, under normal operating conditions of an elevator installation, obstacles such as persons and objects will generate rapidly variable error signals, while interferences (disturbing influences) will produce slowly changing error signals. The distinction between obstacles and interferences takes place therefore by pseudo-differentiation of the corresponding error signals; that is by comparison of the unretarded with the time-retarded error signal in an additional differential amplifier. Although the door security system designed in this way provides jamming protection, it is still accompanied by serious disadvantages.

One essential disadvantage is that the operation of the compensators is limited to a distance of a few centimeters from the opening of the door, so that the interferences (disturbing influences) are only compensated in this small door region and remain uncompensated in the greater remaining part of the door travel. Thus, the system performs a floor related point-wise balancing of the sensors rather than a compensation of the disturbing influences. This is not only an inefficient utilization of the time that the compensators are available, but the system is forced to differentiate signal-wise between obstacles acting on the door control and disturbing influences not acting on the door control. Since this operation takes place in a differentiating circuit, static obstacles, such as for instance a stationary person in the door region, have to be identified in an additional "static" circuit. This doubling of the evaluating circuitry is expensive and requires additional measures in order to decouple the static from the dynamic circuitry.

A further disadvantage is that disturbing influences in the elevator shaft between the floors can impair the function of the evaluating circuit, because the time constant of the delay element is matched to the door movements on a floor and not to the cabin movement in the elevator shaft. It is therefore necessary to initialize the timing unit at every floor stop, immediately prior to the door opening, by means of a microswitch. This complicates the function sequence for the recognition of the obstacle and reduces its reliability and safety. A further shortcoming is that the aforesaid obstacle recognition system does not have a memory, so that for instance an error signal due to a mechanical deformation and recognized as a disturbing influence has to be identified again and again for each door movement. Identifications already carried out therefore can not be used on subsequent door movements, and long-term influences such as contamination and humidity, which hardly change between the movements of the door, have to identified every time. Such an identification process poorly accommodates error signals, as encountered in normal elevator operation.

SUMMARY OF THE INVENTION

The present invention provides an elevator door control with an automatic differentiation between obstacles acting on the door controls, such as persons or objects, and disturbing influences not acting on the door controls, for instance dirt, temperature or mechanical tolerances, which are active over the entire range of movement of the doors. The invention is easily and rapidly adaptable to different operating conditions of doors and has a simple evaluating circuitry for door control.

Capacitive sensors attached to the closing edges of elevator doors are coupled in pairs to differential amplifiers to generate error signals if associated antennas are capacitively influenced by an obstacle or a disturbance. A door travel detector senses the entire door region in incremental steps represented by electrical pulses which enable the error signals to be inputted to a compensator. Every error signal is subjected to compensation at every door movement and the result is stored on a per floor basis for use in the next compensation cycle. The compensator includes a threshold value detector, a forward/reverse counter and a digital/analog converter for generating a current compensation value which is applied to the corresponding capacitive sensor. The current compensation value is also stored in an incremental balancing storage unit for use in the compensator during the next compensation cycle for the same increment of travel at the same floor. At the beginning of the next compensation cycle, the stored compensation value is inputted to the counter from the storage unit and is incremented or decremented by a predetermined value in accordance with the error signal.

The error signals are also inputted to an evaluating circuit which generates a control signal to the door operator. The compensated error signal is an input to a threshold value detector which generates a door control signal when a predetermined threshold value is exceeded. The door control signal is utilized to activate a buzzer and to stop and reverse the movement of the elevator door.

Error signals originating from disturbing influences are eliminated by the compensation circuitry and therefore no distinction has to be made in the evaluating circuitry between obstacles acting on the door control and disturbing influences not acting on the door control. The prior art differentiation by time between obstacle signals and disturbing influence signals is therefore replaced by the compensating process and the evaluating circuitry can be a simple threshold value detector. The same is equally true for the identification of "static" as well as "dynamic", that is stationary versus moving obstacles, and therefore only one evaluation circuit is required since the time-retarded evaluation is eliminated. Due to the separation of time and amplitude discrimination by the circuits, there exist no troublesome mutual disturbing influences and so the periodic reset of the timing unit and its microswitch are not required.

Since all error signals are entered into the evaluating circuit by way of a common gate which passes the largest signal, only a single threshold detector circuit is required even in the case of a multitude of sensors. Such a circuit is therefore easily resettable if this should become necessary in a door security system due to changing operating conditions. Further advantages result from the fact that the compensation of the error signals occurs at every door movement and is distributed in small steps over the entire range of movement of a door. Slowly variable disturbing influences can thus be compensated to a minimum amplitude, regardless of their size. This makes possible a high sensitivity in the recognition of obstacles, reduces the requirements with regard to the distance from the disturbance, and leads to an increased freedom in the electrical and mechanical design of the door installation and closure protection. All these advantages do not cost more, but result as a consequence of a better utilization in time of the compensator circuits.

It is an object of the above-described invention to provide a highly sensitive and reliable obstacle detection system which can be utilized with automatic elevator door controls, intruder detection systems, protection devices for dangerous machinery and working platforms, and collision protection systems for vehicles.

BRIEF DESCRIPTION OF THE DRAWINGS

These and other objects and advantages of the present invention will be apparent to those skilled in the art in the light of the present disclosure including the drawings, in which.

DESCRIPTION OF THE PREFERRED EMBODIMENT

Figure 1:
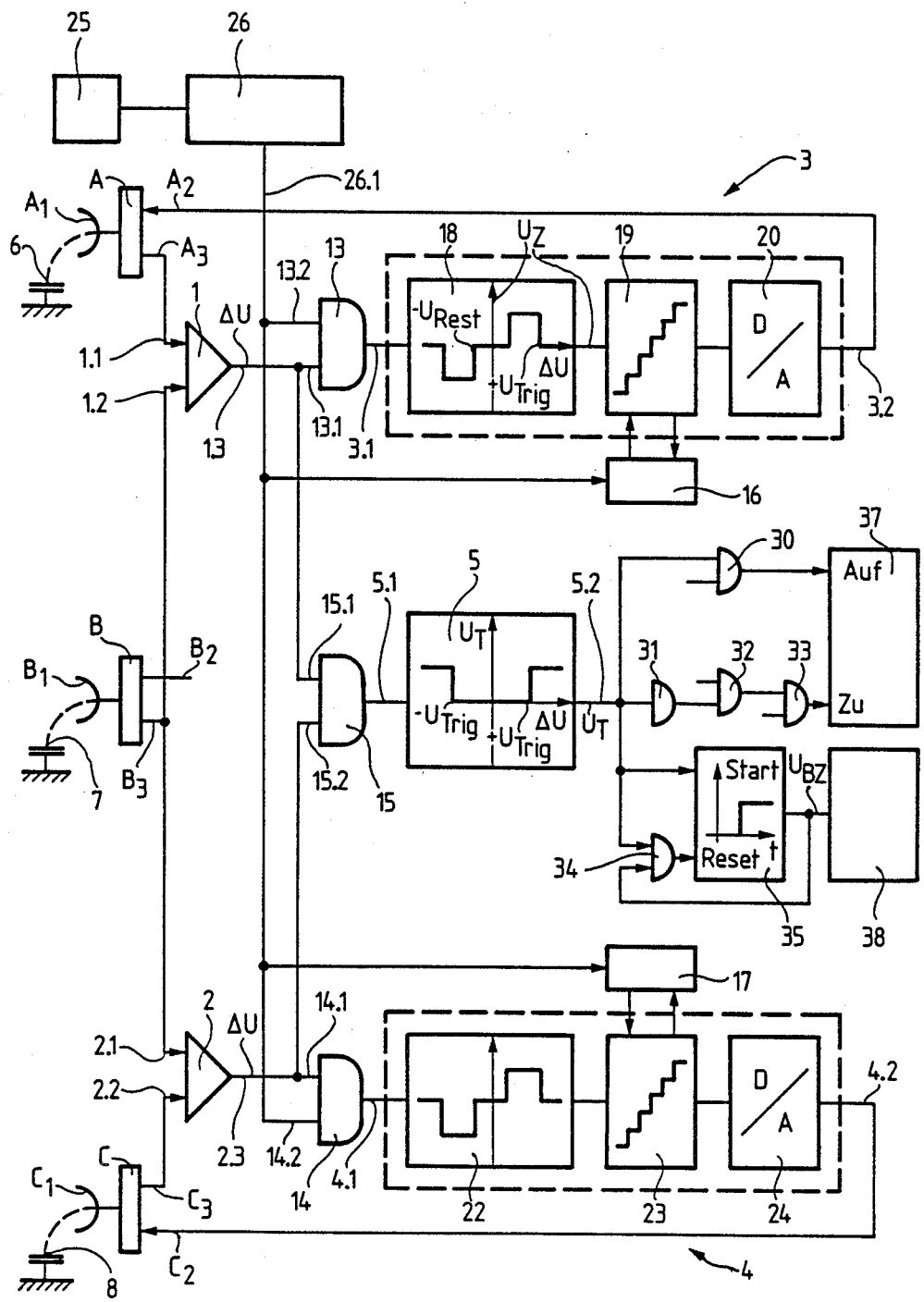
FIG. 1 is a schematic block diagram of the obstacle detection system according to the present invention utilizing three capacitive approach sensors.

Referring to the drawings, FIG. 1 is a schematic representation of an obstacle detection system, according to the invention, having three capacitive sensors A, B and C which can be located, for example, along an elevator door closing edge (not shown). A pair of differential amplifiers 1 and 2 are provided, each for receiving and comparing two sensor signals to generate an error signal. The error signals from the differential amplifiers are inputs to a pair of compensators 3 and 4 which compensate the error signals as will be described below. The error signals are also inputs to evaluating circuitry 5 for the generation of a door control signal $U_T$.

The sensors A, B and C are each connected with a respective antenna $A_1$, $B_1$ and $C_1$ attached to an edge of an elevator door. Each of the antennas exhibits capacitance with respect to the circuit ground due in part to the physical location of the antenna. These capacitances are represented in FIG. 1 as capacitors 6, 7 and 8 associated with the antennas $A_1$, $B_1$ and $C_1$ respectively. Each of the sensors A, B and C has a compensating input $A_2$, $B_2$ and $C_2$ respectively. The input $A_2$ is connected to a compensating output 3.2 of the compensator 3 and the compensating input $C_2$ is connected to a compensating output 4.2 of the compensator 4. The compensating input $B_2$ is not connected.

Each of the differential amplifiers 1 and 2 is connected to an output from two of the sensors. For example, the differential amplifier 1 has an input 1.1 connected to an output $A_3$ of the sensor A and an input 1.2 connected to an output $B_3$ of the sensor B. The differential amplifier 2 has an input 2.1 connected to the output $B_3$ and an input 2.2 connected to an output $C_3$ of the sensor C. An output 1.3 of the differential amplifier 1 is connected to an input 13.1 of an analog And gate 13. The output 1.3 is also connected to an input 15.1 of an analog gate 15. The differential amplifier 2 has an output 2.3 connected to an input 14.1 of an analog And gate 14. The output 2.3 is also connected to an input 15.2 of the gate 15. Thus, the error signals U are coupled to the compensator 3, the compensator 4 and the evaluating circuit 5 by the gates 13, 14 and 15 respectively.

The compensators 3 and 4 are identical and cooperate with incremental balancing storage units 16 and 17 respectively. The compensator 3 has an input 3.1 connected to an output of the gate 13. The input 3.1 is an input to a threshold value detector 18 having an output connected to an input of a forward/reverse counter 19 which has an output connected to an input of a digital-/analog converter 20. An output of the converter 20 is connected to the output 3.2 of the compensator 3. In a similar manner, the compensator 4 has an input 4.1 connected between an output of the gate 14 and an input of a threshold value detector 22. The detector 22 has an output connected to an input of a forward-/reverse counter 23 which has an output connected to an input of a digital/analog converter 24. The converter 24 has an output connected to the output 4.2 of the compensator 4. The detectors 18 and 22 generate a count pulse $U_z$ when the amplitude of the error signal $\Delta U$ is between the threshold values of $\pm U_{Rest}$ and $\pm U_{Trig}$. The count pulse $U_z$ increments or decrements the respective counters 19 and 23 for positive and negative error signals respectively.

The compensation process is initiated by a door travel detector 25 which senses the travel distance of the elevator door and drives a pulse generator 26. The pulse generator 26 generates an output pulse ($I_S$ in FIG. 2) per increment of travel distance $\Delta S$ which can be for example one centimeter. These travel distance pulses $I_S$ can be generated at an output 26.1 with an adjustable pulse width $\tau$. The output 26.1 is connected to an input 13.2 of the gate 13 and an input 14.2 of the gate 14. The output 26.1 is also connected to an input of each of the incremental balancing storage units 16 and 17. Thus, the travel distance pulses $I_S$ enable the gates 13 and 14 to pass the error signals to the compensators 3 and 4 respectively and at the same time enable the storage units 16 and 17.

The evaluating circuit 5 is a simple threshold value having the threshold values $+U_{Trig}$ and $-U_{Trig}$. detector An output of the gate 15 is connected to an input 5.1 of the evaluating circuit 5 such that it functions in parallel with the compensators 3 and 4. The larger of the error signals from the differential amplifiers 1 and 2 is generated at the input 5.1. The evaluating circuit 5 generates the door control signal $U_T$ at an output 5.2 when the error signal exceeds the threshold value. The output 5.2 is connected to an input of an And gate 30 and an input of an And gate 31. The gate 31 has an output connected to an input of an And gate 32 which has an output connected to an input of an And gate 33. The output 5.2 is also connected to an input of an And gate 34 and an input of a timer circuit 35. The gate 30 has an output connected to an input Auf of a door drive 37. The gate 33 has an output connected to another input Zu of the door drive 37. The gate 34 has an output connected to a Reset input of the timer 35. The timer 35 has an output for generating a signal $U_{BZ}$ to an input of a buzzer 38. The output of the timer 35 is also connected to another input of the gate 34.

Figure 2:
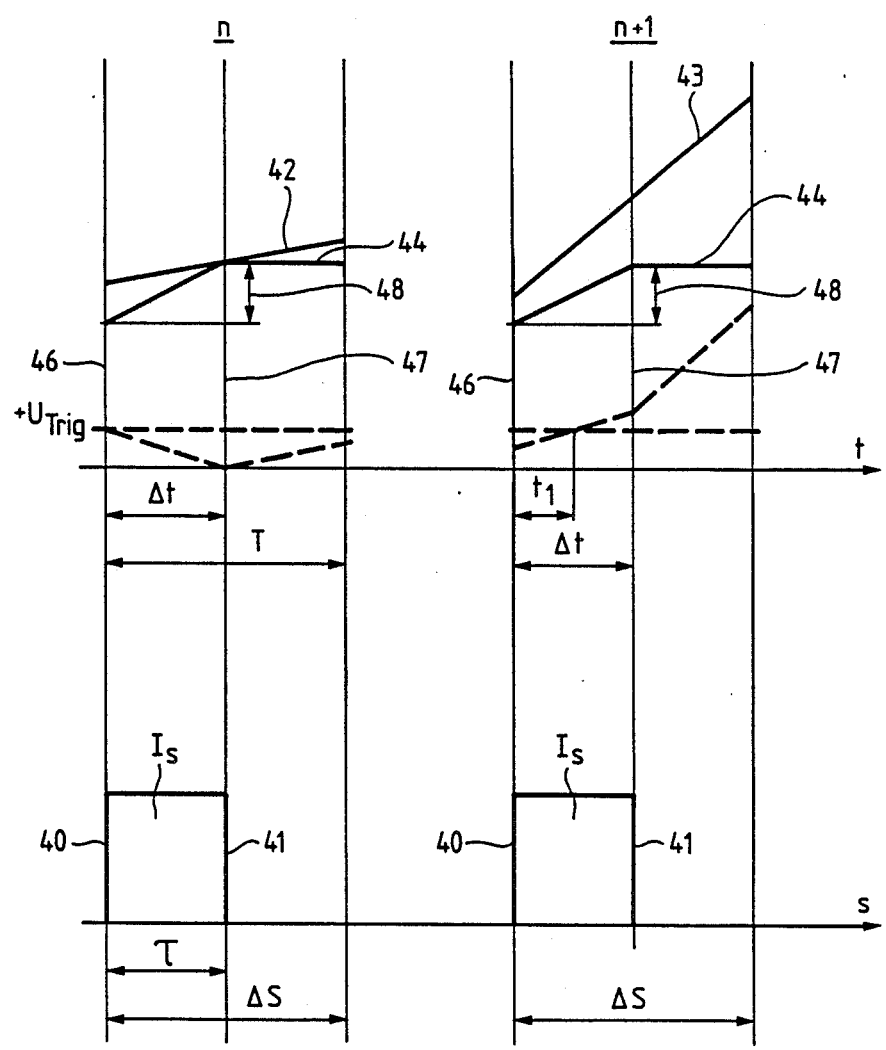
FIG. 2 is a wave form diagram of various signals generated in the compensation circuit of the invention shown in FIG. 1.

The travel distance pulses $I_S$, which are generated by the pulse generator 26 during the compensation process per travel distance increment $\Delta S$, are plotted as amplitude versus distance "S" in FIG. 2. The distance "S" represents the distance the door has moved from the closed position. Every pulse $I_S$ comprises a rising leading edge 40 and a falling trailing edge 41 as well as the adjustable pulse width $\tau$. FIG. 2 shows the basic compensation process for a slowly variable uncompensated error signal ($\Delta U$) 42 in the region of the n-th travel distance increment and for a rapidly variable uncompensated error signal ($\Delta U$) 43 in the region of the (n+1)-th travel distance increment. A compensation signal 44 is plotted as amplitude versus time "t" since the elevator door began to open and is characterized in both cases by an initial value 46, a final value 47, as well as a maximum compensating value change 48 attainable during the compensating time $\Delta t$. which corresponds to the pulse width $\tau$. The slowly variable error signal 42 is reduced by the compensating signal 44 to a value (lower dashed line) less than $+U_{Trig}$ (horizontal dashed line) by the evaluating circuit 5 during the time period "T" which corresponds to the travel distance increment while the rapidly variable error signal 43 exceeds (upwardly sloped dashed line) the threshold value $+U_{Trig}$ after time $t_1$.

Figure 3A:
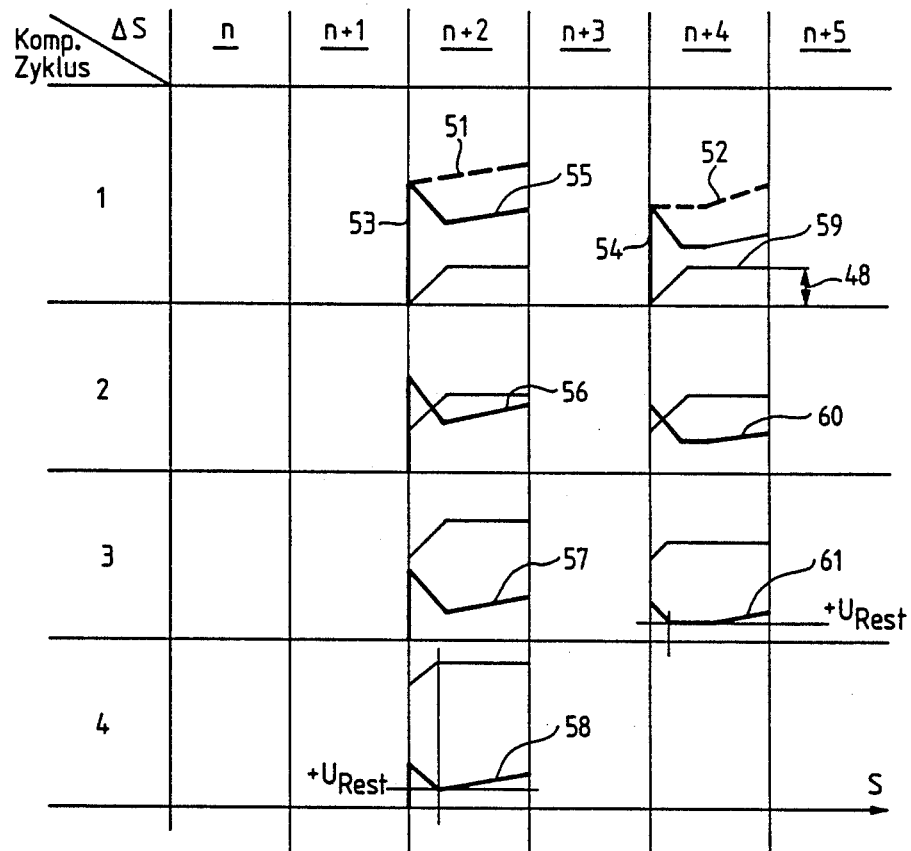
FIG. 3a is a diagram of various wave forms generated during initialization of the invention shown in FIG. 1.
Figure 3B:
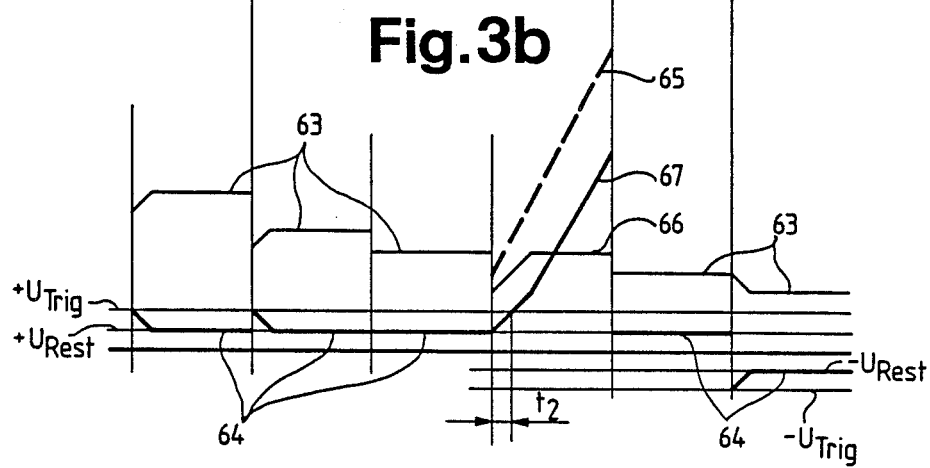
FIG. 3b is a diagram of various wave forms generated by the invention shown in FIG. 1 during recognition of an obstacle.

The signals generated by the circuit of FIG. 1 during initialization and during the recognition of an obstacle are shown in FIG. 3a and FIG. 3b. In FIG. 3a, a slowly variable uncompensated error signal 51 is generated during the (n+2)-th travel distance increment and a slowly variable uncompensated error signal 52 is generated during the (n+4)-th travel distance increment. These error signals can be caused, for example, by the configuration of the elevator structure and are characterized as disturbing influences. The error signals 51 and 52 have initial amplitudes 53 and 54 respectively. The circuitry operates to balance the corresponding sensor relative to these initial disturbing influences. Based upon the amplitudes of the error signals 51 and 52, four compensating cycles and three compensating cycles respectively are required to fully compensate. With respect to the error signal 51, compensating steps 55, 56, 57 and 58 are performed to reach the threshold value $+U_{Rest}$. In the case of the error signal 52, compensating steps 59, 60 and 61 are required to reach the threshold value.

In FIG. 3b, there are shown the wave forms for compensating signals 63 and compensated error signals 64 for a completely initialized circuit. An obstacle, for example a person entering the elevator cabin, is present in the region of the (n+3)-th travel distance increment. The corresponding uncompensated error signal 65 can not be compensated completely with the compensating signal 66 so that only the partly compensated error signal 67 exceeds the threshold value $+U_{Trig}$ of the evaluating circuit 5 after time period $t_2$.

The signals in FIG. 2, FIG. 3a and FIG. 3b are illustrated as having linear sections for the sake of simplification. Of course, the signals can exhibit a non-linear characteristic.

The modes of operation of the invention are compensation, initialization and recognition of obstacles. For the explanation of the compensation process, it shall be assumed that an automatic elevator door equipped with the invention is in the course of the closure movement and encounters with its closure edge a disturbing influence such as dirt, temperature or mechanical tolerances, or an obstacle such as persons or objects, whereby in both cases the capacitances with respect to ground of a least two neighboring sensor antennas are changed. It shall furthermore be assumed that this capacitance change concerns sensors A and B and, therefore, produces unequal sensor signals at the inputs 1.1 and 1.2 of the differential amplifier 1, so that from its output 1.3 an error signal is fed to the inputs 13.1 and 15.1 of the gate 13 and the gate 15 respectively. The compensation of the error signal is controlled during every travel distance increment by the associated travel distance pulse $I_S$. The compensation value 46 (FIG. 2), determined at the preceding compensation cycle for the same travel distance increment and the same floor, is first preset at the leading edge 40 into the forward/reverse counter 19. This compensation value from the preceding compensation cycle was generated by the counter 19 to the incremental balancing storage unit 16 and stored when the leading edge 40 of the travel distance pulse was received by the storage unit 16 from the pulse generator 26. Thus, the counter 19 functions to store the compensation value from the preceding compensation cycle and then generates said compensation value at the beginning of the next compensation cycle.

The error signal is inputted, during the travel distance pulse duration by way of the gate 13, into the threshold detector 18 which checks for its sign and compares it to threshold values. In the range $\pm U_{Rest}$ to $\pm U_{Trig}$, a count pulse $\pm U_z$ is generated to increment or decrement the forward/reverse counter 19. A first threshold value $\pm U_{Rest}$ determines those limit values within which the error signal should lie after compensation. Error signals in the range $\pm U_{Rest}$ are thus not compensated. A second threshold value $\pm U_{Trig}$ defines that maximum value of error signal which can arise by different door capacitances per floor or by long term influences (deformations, temperature, humidity) in case of an obstacle-free door entrance. In the range $U_{Rest}$ less than or equal to the absolute value of $\Delta U$ less than or equal to $U_{Trig}$, that is in the range of compensation, there is present the signal $U_Z$ at the output of the threshold value detector 18 which makes the counter 19 run forward or backward depending on the sign of the error signal. The circuit 3 generates a compensating voltage at the compensating input A2 by way of the digital-/analog converter 20. The compensating voltage decreases the error signal value below $\pm U_{Rest}$ whereupon $U_Z$ disappears and the counter stops.

At the conclusion of the compensating process, the last occurring counter value, that is the compensation value 47 (FIG. 2) for the associated travel distance and floor is stored at the trailing edge 41 of $I_S$ in the storage unit 16 in order to be inputted at the beginning of the next compensation cycle of the same travel distance increment and floor with the leading edge 40 of $I_S$ as the new compensating value 46 into the forward/reverse counter. Since the door travel detector 25 subdivides the door travel distance S into small steps or travel distance increments, it is possible to compensate error signals with high resolution to minimal residual amplitudes. The maximum compensation value variation 48 attainable during each travel distance increment determines the borderline between slowly variable error signals, which are compensated completely, and rapidly variable error signals, which are only compensated to a small part. Because this threshold value is specific to the installation, for instance it depends on the door velocity acting as time compression or time expansion, a corresponding match of the maximum compensation value change 48 is necessary for every door installation. In the present case this is assured by a variable compensation time $\Delta t$, for which the pulse width of the pulse generator 26 is adjustable. In an analogous manner, the error signals from the sensors B and C at the output 2.3 of the differential amplifier 2 are compensated by the compensator 4 and the storage unit 17.

The evaluating circuit 5, connected in parallel with the compensators 3 and 4, is a pure amplitude discriminator. Only error signals the amplitudes of which lie, in spite of compensation, outside the range bounded by $-U_{Trig}$ and $-U_{Trig}$ enable the threshold value detector 5 to generate the door control signal $U_T$ and thus can activate the door drive 37. It is obvious that the compensation acts equally on error signals caused by disturbing influences and those caused by obstacles. For differentiation between the two causes, one starts out from the knowledge that in normal elevator operation disturbing influences and obstacles produce slowly variable and rapidly variable error signals respectively. By means of a pulse width which is adjustable, the compensation time is then chosen in such a manner that slowly variable error signals are completely compensated with the compensation value change 48 maximally attainable during a travel distance increment, while rapidly variable error signals exhibit sufficient amplitude after compensation to be active for the door control by way of the evaluating circuit 5.

The initialization according to FIG. 3a represents compensation of the disturbing influences existing initially after installation, such as for instance due to constructional elements in the elevator shaft, mechanical tolerances, unsymmetries in the electronic circuitry, etc., and assures thereby a mutual matching of door installation and equipment according to the invention. This is necessary because otherwise the disturbing influences would intolerably reduce the response sensitivity of the obstacle recognition. The door will therefore travel initially through the entire door region in an obstacle-free state until all disturbing influences, which of course are slowly variable, have been made ineffective by successive compensation. The equipment according to the invention therefore traverses the door region in an obstacle-free state and memorizes the location and amplitude of every disturbing influence. The disturbing influence 51 assumed in the (n+2)-th travel distance increment is reduced by the aforementioned compensating process in four steps 55,56,57 and 58 to the smaller amplitude $+U_{Rest}$. As the disturbing influence 52 in the (n+4)-th travel distance increment exhibits a smaller amplitude than the disturbing influence 51, the threshold value $+U_{Rest}$ is reached with equal maximum compensating value changes 48 after the three steps 59, 60 and 61. After performing initialization, the incremental balancing storage units 16 and 17 each contain a travel distance and floor referenced amplitude image conforming to the disturbing influences distributed across the door region. This image is updated at every door movement.

FIG. 3b is a wave form diagram representing the operational recognition of a obstacle (person or object) the capacitive action of which is limited to the (n+3)-th travel distance increment for the sake of simplicity. Since in all travel distance increments the disturbing influences are compensated by the compensating signals 63 into error signals 64, the obstacle in the (n+3)-th travel distance increment can be detected with full sensitivity. The corresponding error signal 65 is rapidly variable so that its compensation by the compensating signal 66 leads to an error signal 67 which reaches the threshold value $+U_{Trig}$ of the evaluation circuit 5 after time $t_2$ and thus becomes active in controlling the door. This can lead to a stop or a reversal of the door drive, both functions which are dominant in comparison to the door closing command. For example, the door control signal $U_T$ together with another signal will generate a control signal from the gate 30 to the Auf input of the door drive 37 to cause the elevator door to reverse. The door control signal $U_T$ also passes through the gate 31 and can be combined with another signal at the gate 32 and still another signal at the gate 33 to generate a signal to the Zu input of the door drive 37 to stop the elevator door. Normally the obstacle disappears after a short time, so that the error signal becomes less than $U_{Trig}$ and the door will close again. If the obstacle remains, the signal $U_{BZ}$ will be generated by the timer circuit 35 after a selectable time and the door closing process initiated simultaneously with reduced velocity. Of course an obstacle will also be detected when a disturbing influence is superimposed, but the disturbing influence is made completely ineffective with regard to door control after several compensating cycles.

It is evident that the invention is not limited to the aforementioned embodiment. It is possible to use other sensors, which, for instance operate photoelectrically, or inductively, or with ultrasonic measurement and also the number of sensors distributed across the edge of the door does not in any way have to be limited to three. Compensators and switching logic can be implemented in discrete component technology or, in process controlled door devices with digital computer technology, in which case the functions for amplitude discrimination, forward/reverse counting, comparison, time determination etc., are designed advantageously as subroutines.

In accordance with the provisions of the patent statutes, the present invention has been described in what is considered to represent its preferred embodiment. However, it should be noted that the invention can be practiced otherwise than as specifically illustrated and described without departing from its spirit or scope.

What is claimed is:

1. An automatic elevator door system for the recognition of obstacles having a plurality of antennas distributed across a closing edge of an elevator door, a plurality of capacitive sensors each coupled to an associated one of the antennas for generating a sensor signal representing the capacitance between the antenna and circuit ground, a plurality of differential amplifiers each coupled to a pair of the sensors for the reception and comparison of two of the sensor signals and for the generation of an error signal representing the difference between the received sensor signals, a compensator circuit coupled to the differential amplifiers for the compensation of each error signal, and an evaluating circuit coupled to the amplifiers and responsive to the error signals for the generation of a door control signal further comprising:

a door travel detector for sensing the entire range of movement of the elevator door and controlling the compensator circuit during incremental motions of the door to compensate only during the closing movement of the door rapidly variable ones of the error signals, the evaluating circuit being responsive to said rapidly variable error signals for generating a door control signal.

2. A system according to claim 1 wherein a pulse generator is driven by said door travel detector to generate door travel distance pulses representing the incremental motions of the door to the compensator circuit with a selected pulse width sufficient to enable the compensator circuit to respond to said error signals.

3. A system according to claim 2 wherein the compensation time of every travel distance increment coincides with the pulse duration of the corresponding one of said travel distance pulses.

4. A system according to claim 3 wherein the compensation value variation maximally attainable during the door travel time for each travel distance increment is proportional to the compensating time which is determined by the pulse width for which said pulse generator is selectively adjustable.

5. A system according to claim 1 wherein the compensator circuit includes a threshold value detector responsive to ones of said error signals only in a predetermined amplitude range.

6. A system according to claim 1 wherein a gate circuit is coupled between the differential amplifiers and the evaluating circuit for switching only the largest of said error signals into the evaluating circuit.

7. A system according to claim 1 wherein the evaluating circuit includes a threshold value detector responsive only to ones of said error signals in a predetermined range for generating said door control signal.

8. A system according to claim 7 wherein the compensator circuit includes a threshold value detector responsive to ones of said error signals only in a predetermined amplitude range and the compensator circuit and the evaluating circuit have the same threshold values.

9. A system according to claim 1 wherein the compensator circuit includes a threshold value detector coupled to a forward/reverse counter coupled to a digital/analog converter and an incremental balancing storage unit coupled to said counter.

10. A system according to claim 9 wherein said counter generates a compensation value, existing after expiration of the compensation time for every door travel distance increment, which value is maintained constant during the remaining door travel time and is stored as a starting value per floor for the next compensation of the identical travel distance increment in said storage unit.

11. A system according to claim 9 wherein the compensation value determined by the compensator circuit for each travel distance increment is transferred by the compensator circuit at a trailing edge of an associated one of said travel distance pulses into said storage unit and at a leading edge of the next one of said travel distance pulses of the same travel distance increment in a reverse direction.

12. A system according to claim 1 wherein for every travel distance increment of the door the compensation time for compensation of an error signal is less than the corresponding door operating time.

13. A system according to claim 1 wherein for every door travel distance increment, during the compensation time, the maximally attainable compensation value variation for said rapidly variable error signals can only compensate to a relatively small degree and said rapidly variable error signals are therefore active in door control through the evaluating circuit which includes a threshold value detector responsive to said error signals.

14. In an automatic elevator door control having sensor means for generating error signals representing obstacles and disturbances, a compensation circuit responsive to the error signals for generating a compensation signal to the sensor means and an evaluating circuit responsive to the error signals representing obstacles for generating a door control signal to control an elevator door associated with the sensor means, an obstacle detection system comprising:

a door travel detector means for sensing movement of an elevator door and generating a travel distance signal representing an incremental distance of movement of the door to a compensation circuit to enable said compensation circuit to generate a compensation signal during the associated incremental movement of the door; and storage means coupled to said compensation circuit for storing said compensation signal.

15. A system according to claim 14 wherein said storage means is responsive to said travel distance signal for generating said stored compensation signal to said compensation circuit in response to the generation of said travel distance signal during the next movement of the door through the same incremental distance.

16. A system according to claim 14 wherein said door travel detector means generates a plurality of travel distance signals each representing an incremental distance of movement of the door, said storage means stores said compensation signal for each of said travel distance signals for each floor at which the door is opened, and said storage means is responsive to each of said travel distance signals for generating an associated one of said stored compensation signals to said compensation circuit.

17. A system according to claim 14 wherein said door travel detector means includes a pulse generator for generating a travel distance pulse for each incremental distance of movement of the door.

18. A system according to claim 17 wherein said pulse generator is selectively adjustable for controlling the duration of said travel distance pulses.

19. A system according to claim 17 wherein the duration of each of said travel distance pulses is less than the time of travel of the door in the associated incremental distance of travel.

20. An elevator door obstacle detection and control system comprising:

at least two sensors positioned to generate sensor signals representing obstacles and disturbances at an associated elevator door;

at least one differential amplifier coupled to said two sensors and responsive to said sensor signals for generating a current error signal;

at least one compensation circuit coupled between said one differential amplifier and one of said two sensors and responsive to said current error signal for genrating a compensation signal to said one differential amplifier, said compensation circuit including a storage unit for storing a compensation value genrated in response to a preceding error signal and means responsive to said compensation value and said current error signal for generating said compensation signal; and an evaluation circuit coupled to said one differential amplifier and responsive to said error signal for generating a control signal for controlling an elevator door.

21. A system according to claim 20 including first, second and third ones of said sensors, and first and second ones of said differential amplifiers, said first differential amplifier having a pair of inputs connected to outputs of said first and second sensors and said second differential amplifier having a pair of inputs connected to outputs of said second and third sensors, and including first and second comparison circuits, said first comparison circuit being coupled between an output of said first differential amplifier and an input of said first sensor and said second comparison circuit being coupled between an output of said second differential amplifier and an input of said third sensor, and a gate circuit having a pair of inputs coupled to said outputs of said first and second differential amplifiers and an output coupled to an input of said evaluation circuit, said gate circuit passing only the larger in amplitude of said error signals generated by said first and second differential amplifiers.

* * * * *

UNITED STATES PATENT AND TRADEMARK OFFICE
CERTIFICATE OF CORRECTION

PATENT NO. : 4,732,238

DATED : March 22, 1988

INVENTOR(S) : MAX BAUMGARTNER

It is certified that error appears in the above-identified patent and that said Letters Patent are hereby corrected as shown below: Title page:

In item [30] on page 1 of the Patent, change "[CA] Canada" to --[CH] Switzerland--.

Signed and Sealed this

Twenty-first Day of February, 1989

Attest:

DONALD J. QUIGG

Attesting Officer   Commissioner of Patents and Trademarks